US006891371B1

(12) United States Patent
Frigo et al.

(10) Patent No.: US 6,891,371 B1
(45) Date of Patent: May 10, 2005

(54) METHOD AND SYSTEM OF GENERATING AN MRS SPECTRUM FROM MULTIPLE RECEIVER DATA

(75) Inventors: Frederick J. Frigo, Waukesha, WI (US); James A. Heinen, Wauwatosa, WI (US); Thomas E. Raidy, Elm Grove, WI (US); Jeffery A. Hopkins, Pewaukee, WI (US)

(73) Assignee: GE Medical Systems Global Technology Co. LLC, Waukesha, WI (US)

( * ) Notice: Subject to any disclaimer, the term of this patent is extended or adjusted under 35 U.S.C. 154(b) by 38 days.

(21) Appl. No.: 10/615,714

(22) Filed: Jul. 9, 2003

(51) Int. Cl.[7] ................................................ G01V 3/00
(52) U.S. Cl. ...................................... 324/307; 324/309
(58) Field of Search ............................... 324/307, 309, 324/312, 314, 300

(56) References Cited

U.S. PATENT DOCUMENTS

| RE32,748 E | 9/1988 | Ordidge et al. |
| 5,077,524 A | 12/1991 | Hurd et al. |
| 5,617,861 A | 4/1997 | Ross et al. |
| 5,903,149 A | * 5/1999 | Gonen et al. ................ 324/307 |
| 6,069,478 A | 5/2000 | Hurd |

OTHER PUBLICATIONS

Li, J. and Stoica, P; An Adaptive Filtering Approach to Spectral Estimation and SAR Imaging, IEEE Transactions on Signal Processing, vol. 44, No. 6, Jun. 1996.
Capon, J. High–Resolution Frequency–Wavenumber Spectrum Analysis. Proceedings of the IEEE. vol. 57, No. 8, pp. 1408–1418, Aug. 1969.
Stoica, P. and Sundin, T. Nonparametric NMR Spectroscopy. Journal of Magnetic Resonance 152, pp. 57–69, 2001.
L.L. Wald et al., Proton Spectroscopic Imaging of the Human Brain Using Phased Array Detectors, MRM, Oct. '95, pp. 440–445, vol. 34, No. 3.

* cited by examiner

*Primary Examiner*—Louis Arana
(74) *Attorney, Agent, or Firm*—Ziolkowski Patent Solutions Group, LLC; Michael A. Della Penn; Carl B. Horton

(57) ABSTRACT

A system and method for multi-channel MR spectroscopy (MRS) includes simultaneously acquiring MR signals from multiple coils and processing the MR signals individually to generate multiple sets of MRS results. The multiple sets of MRS results are combined to form a single superset of MRS results that is displayed as a simple proton MRS absorption spectrum.

27 Claims, 3 Drawing Sheets

METHOD AND SYSTEM OF GENERATING AN MRS SPECTRUM FROM MULTIPLE RECEIVER DATA

BACKGROUND OF THE INVENTION

The present invention relates generally to magnetic resonance spectroscopy (MRS) and, more particularly, to a system and method for multiple-receiver proton spectroscopy such that a single absorption spectrum is generated as a combination of data received from multiple receiver coils.

When a substance such as human tissue is subjected to a uniform magnetic field (polarizing field $B_0$), the individual magnetic moments of the spins in the tissue attempt to align with this polarizing field, but precess about it in random order at their characteristic Larmor frequency. If the substance, or tissue, is subjected to a magnetic field (excitation field $B_1$) which is in the x-y plane and which is near the Larmor frequency, the net aligned moment, or "longitudinal magnetization", Mz, may be rotated, or "tipped", into the x-y plane to produce a net transverse magnetic moment Mt. A signal is emitted by the excited spins after the excitation signal $B_1$ is terminated and this signal may be received and processed to form an image or a magnetic resonance spectroscopy.

When utilizing these signals to produce images, magnetic field gradients ($G_x$, $G_y$, and $G_z$) are employed. Typically, the region to be imaged is scanned by a sequence of measurement cycles in which these gradients vary according to the particular localization method being used. The resulting set of received NMR signals is digitized and processed to reconstruct the image using one of many well known reconstruction techniques.

Magnetic Resonance Spectroscopy (MRS) may be used in vivo for the determination of individual chemical compounds located within a volume of interest. The underlying principle of MRS is that atomic nuclei are surrounded by a cloud of electrons which slightly shield the nucleus from any external magnetic field. As the structure of the electron cloud is specific to an individual molecule or compound, the magnitude of this screening effect is then also a characteristic of the chemical environment of individual nuclei. Since the resonant frequency of the nuclei is proportional to the magnetic field it experiences, the resonant frequency can be determined not only by the external applied field, but also by the small field shift generated by the electron cloud. Detection of this chemical shift, which is usually expressed as "parts per million" (PPM) of the main frequency, requires high levels of homogeneity of the main magnetic field Be.

Typically, MR proton spectroscopy is used to generate a one-dimensional (1D) frequency spectrum representing the presence of certain chemical bonds in the region of interest. In medical diagnosis and treatment, MRS provides a non-invasive means of identifying and quantifying metabolites from a region of interest, often the human brain. By finding the relative spectral amplitudes resulting from frequency components of different molecules, medical professionals can identify metabolites indicative of diseases, disorders, and other pathologies such as Alzheimer's disease, cancer, stroke, and the like. In this context, two nuclei are typically of particular interest, HR and $p^{31}$. Phosphorus 31 MRS is directed to the detection of compounds involved in energy metabolism relating to membrane synthesis and degradation. Metabolites of particular interest in proton MRS studies include glutamate (Glu), glutainine (Gln), choline (Cho), creatine (Cre), N-acetylaspartate (NAA), and the inositols (mI and sI).

Recently, increased sampling resolutions and the ability to simultaneously receive data from multiple-channel receiver coils has lead to greater accuracy in MR data acquisition. Accordingly, radiologists and other medical personnel are able to review separate MRS results from each channel for data acquired during a single scan. Additionally, improved data acquisition capabilities have created opportunities for implementing new signal processing algorithms to improve the sensitivity and accuracy of MRS procedures. Specifically, nonparametric techniques, such as Capon analysis and Amplitude and Phase Estimation of a Sinusoid (APES) analysis can provide 2D results for MRS experiments that show both frequency and damping information. These techniques provide improved sensitivity and differentiation between metabolites.

However, whether implementing 1D or 2D proton spectroscopy, interpreting the results of multiple channels can be a tedious and time consuming process because a medical professional must inspect the results from each channel independently. That is, since a separate result for each channel is generated, when reviewing the results, the medical professional must independently interpret the results from each channel. This process of reviewing multiple sets of results and changing therebetween creates an arduous review process that is susceptible to erroneous human estimations and decreases patient throughput. That is, since the medical professional reviewing the results must repeatedly switch between the results from each independent channel, the medical professional is required to estimate an overall review of data acquired from the various independent channels. For example in an 8 channel head coil, a medical professional must individually review data from 8 different receiver channels to make a diagnosis. Relying on human estimation not only lengthens the review process but also complicates the diagnostic process.

It would therefore be desirable to have a system and method capable of generating a single set of results from a multiple receiver MR proton spectroscopy scan.

BRIEF DESCRIPTION OF THE INVENTION

The present invention provides a system and method of generating a single compilation of results from an MR proton spectroscopy scan that overcomes the aforementioned drawbacks. Specifically, the present invention provides a system and method of processing MR signals individually and then combining the multiple sets of MRS results to generate and display a single compilation of MRS results. As such, a radiologist or other medical personnel may make a diagnosis from a single composite spectrum.

In accordance with one aspect of the invention, a method of multi-channel MR spectroscopy (MRS) is disclosed that includes simultaneously acquiring MR signals from multiple coils and processing the MR signals individually to generate multiple sets of MRS results. The method also includes combining the multiple sets of MRS results to form a single superset of MRS results and generating and displaying a proton MRS absorption spectrum from the single superset of MRS results for clinical inspection.

In accordance with another aspect of the invention, a magnetic resonance imaging (MRI) apparatus includes a plurality of gradient coils positioned about a bore of a magnet to impress a polarizing magnetic field and is used to generate a set of MRS results. An RF transceiver system and an RF switch are controlled by a pulse module to transmit and receive RF signals to and from an RF coil assembly to acquire MR images. The MRI apparatus also includes a computer programmed to acquire MR signals from multiple receiver channels and process the MR signals from each channel independently. The computer is further programmed to process MR signals from each coil into a single set of MRS results for each coil, then combine these results into a single composite set of MRS results and display a proton MRS absorption spectrum from the single composite set of MRS results.

In accordance with another aspect of the invention, the invention is embodied in a computer program stored on a computer readable storage medium and having instructions which, when executed by a computer, cause the computer to process MRS results from the multiple coils independently. The computer combines the processed MRS results into a single composite set of MRS results and displays the set as a single MRS absorption spectrum.

Various other features, objects and advantages of the present invention will be made apparent from the following detailed description and the drawings.

BRIEF DESCRIPTION OF THE DRAWINGS

The drawings illustrate one preferred embodiment presently contemplated for carrying out the invention.

In the drawings.

DETAILED DESCRIPTION OF THE PREFERRED EMBODIMENT

Figure 1:
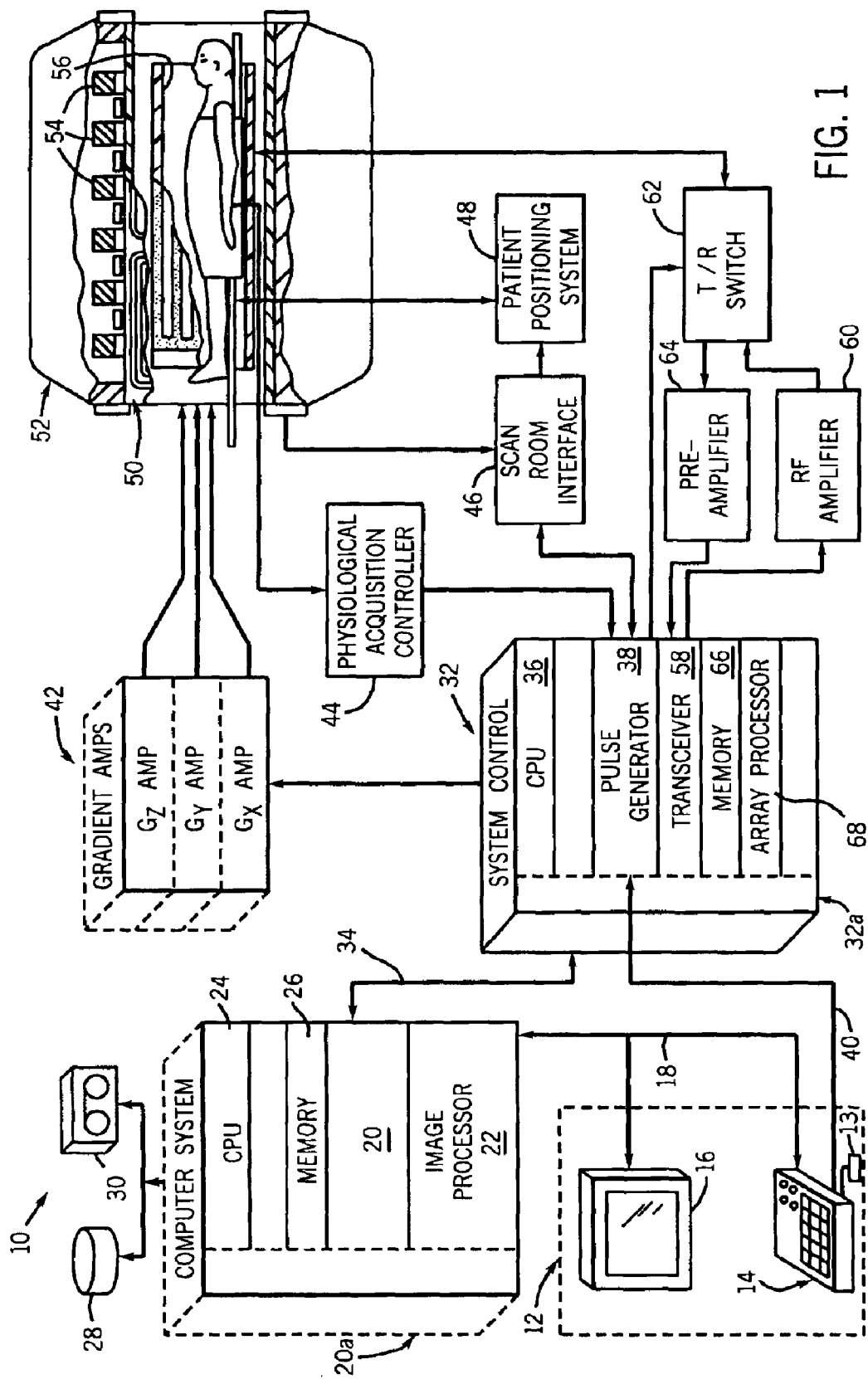
FIG. 1 is a schematic block diagram of an MR imaging system for use with the present invention.

Referring to FIG. 1, the major components of a preferred MRI system 10 incorporating the present invention are shown. The operation of the system is controlled from an operator console 12 which includes a keyboard or other input device 13, a control panel 14, and a display screen 16. The console 12 communicates through a link 18 with a separate computer system 20 that enables an operator to control the production and display of images and MRS results on the display screen 16. The computer system 20 includes a number of modules which communicate with each other through a backplane 20a. These include an image processor module 22, a CPU module 24 and a memory module 26, known in the art as a frame buffer for storing image data arrays. The computer system 20 is linked to disk storage 28 and magneto optical disk (MOD) drive 30 for storage of image data and programs, and communicates with a separate system control 32 through a high speed serial link 34. The input device 13 can include a mouse, joystick, keyboard, track ball, touch-activated screen, light wand, voice control, or any similar or equivalent input device, and may be used for interactive geometry prescription.

The system control 32 includes a set of modules connected together by a backplane 32a. These include a CPU module 36 and a pulse generator module 38 which connects to the operator console 12 through a serial link 40. It is through link 40 that the system control 32 receives commands from the operator to indicate the scan sequence that is to be performed. The pulse generator module 38 operates the system components to carry out the desired scan sequence and produces data which indicates the timing, strength and shape of the RF pulses produced, and the timing and length of the data acquisition window. The pulse generator module 38 connects to a set of gradient amplifiers 42, to indicate the timing and shape of the gradient pulses that are produced during the scan. The pulse generator module 38 can also receive patient data from a physiological acquisition controller 44 that receives signals from a number of different sensors connected to the patient, such as ECG signals from electrodes attached to the patient. And finally, the pulse generator module 38 connects to a scan room interface circuit 46 which receives signals from various sensors associated with the condition of the patient and the magnet system. It is also through the scan room interface circuit 46 that a patient positioning system 48 receives commands to move the patient to the desired position for the scan.

The gradient waveforms produced by the pulse generator module 38 are applied to the gradient amplifier system 42 having $G_x$, $G_y$, and $G_z$ amplifiers. Each gradient amplifier excites a corresponding physical gradient coil in a gradient coil assembly generally designated 50 to produce the magnetic field gradients used for spatially encoding acquired signals. The gradient coil assembly 50 forms part of a magnet assembly 52 which includes a polarizing magnet 54 and a whole-body RF coil 56. A transceiver module 58 in the system control 32 produces pulses which are amplified by an RF amplifier 60 and coupled to the RF coil 56 by a transmit/receive switch 62. The resulting signals emitted by the excited nuclei in the patient may be sensed by the same RF coil 56 and coupled through the transmit/receive switch 62 to a preamplifier 64. The amplified MR signals are demodulated, filtered, and digitized in the receiver section of the transceiver 58. The transmit/receive switch 62 is controlled by a signal from the pulse generator module 38 to electrically connect the RF amplifier 60 to the coil 56 during the transmit mode and to connect the preamplifier 64 to the coil 56 during the receive mode. The transmit/receive switch 62 can also enable a separate RF coil (for example, a surface coil) to be used in either the transmit or receive mode.

The MR signals picked up by the RF coil 56 are digitized by the transceiver module 58 and transferred to a memory module 66 in the system control 32. A scan is complete when an array of MR raw data has been acquired in the memory module 66. This MR raw data is input to an array processor 68 which processes the MR raw data as necessary to create the desired results which may include image data or MRS results. The image data or MRS results are conveyed through the serial link 34 to the computer system 20 where they are stored in memory, such as disk storage 28. In response to commands received from the operator console 12, the image data or MRS results may be archived in long term storage, such as on the MOD drive 30, or may be further processed by the image processor 22 and conveyed to the operator console 12 and presented on the display 16.

The present invention includes a system and method suitable for use with the above-referenced MR system, or any similar or equivalent system for obtaining MR data. Proton MRS can be implemented on the above-referenced MR system and is used in vivo to measure the concentration of a number of metabolites. High-field magnetic resonance scanners (1.5 T or greater) are typically used to perform MRS studies involving a number of pathologies, including but not limited to, cancer, multiple sclerosis, Alzheimer's disease, and acute stroke.

Figure 2:
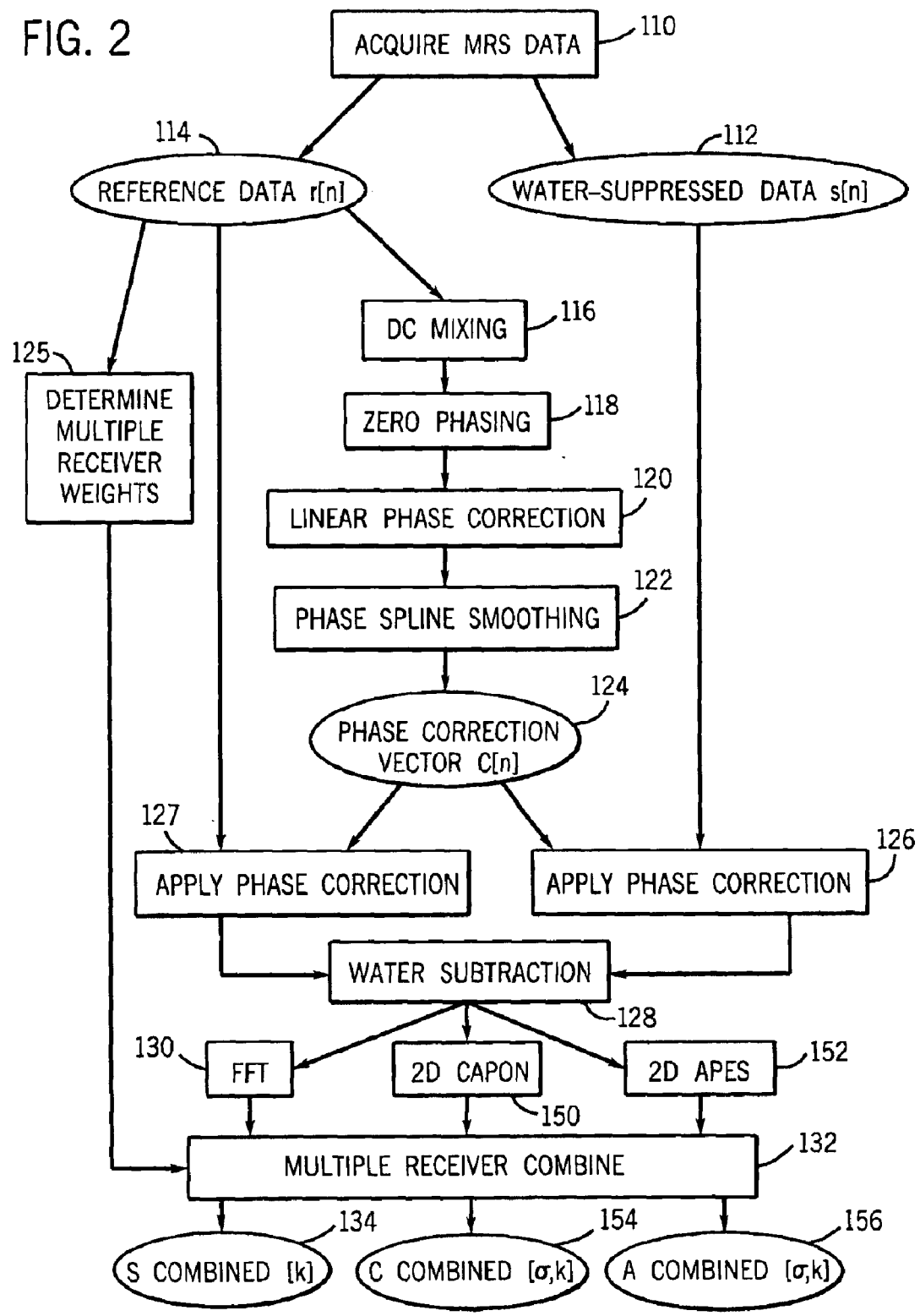
FIG. 2 is a flow chart setting forth the steps of compiling a single absorption spectrum from a multiple receiver MR proton spectroscopy scan in accordance with one embodiment of the present invention.

Referring now to FIG. 2, an MRS scan is conducted to simultaneously acquire data for a 1D or 2D absorption spectrum plot from multiple receiver channels of an MR system. The MRS scan includes a reference data acquisition in which a signal is acquired from a region or volume of interest. The MRS scan also includes a water-suppressed data acquisition in which the dominant water signal has been removed via a chemical selective saturation, such as a known CHESS pulse sequence. The MRS data acquisition requires that a number of scan parameters be determined for each region of interest. The center frequency, flip angle, transmit gain, receive gain, and shimming parameters are determined for each MRS experiment during prescan. These parameters are optimized for a particular TE and TR selected for a particular scan.

After sampling the acquired MR signals, the MR data can be represented as a mixture of R complex damped sinusoids:

$$x[n] = \sum_{r=1}^{R} A_r e^{j\theta_r} e^{(-\sigma_r + j\omega_r)n} + \varepsilon[n] \quad \text{(Eqn. 1)}$$

where $A_r$, $\theta_r$, $\sigma_r$, and $\omega_r$, are the amplitude, phase, damping factor and angular frequency of the $r^{th}$ component, respectively, and $\epsilon[n]$ is a noise term.

After data acquisition, the raw data is pre-processed as 1D data. That is, once non-water suppressed reference data is collected 114, averaging is used to yield an averaged set of reference data, r[n], where n is an index representing each sampled complex data point. This raw data averaging is done for each coil.

The reference data, r[n], undergoes DC mixing 116, zero phasing 118, linear phase correction 120 and phase spline smoothing 122, to determine a phase correction vector 124, c[n]. Additionally, the reference data, r[n], is used to determine weighting 125 for the data of a respective coil. Simply, weighting 125 is carried out to determine data influence from a particular coil on a combined spectrum or image. Specifically, if it is determined that the data of a particular coil should be used, the reference data, r[n], is also used to assign weight to the receiver channels.

The weighting 125 can be determined through multiple considerations. For a particular coil, a maximum magnitude for the averaged reference data, r[n], can be used as a particular weighting factor, $w_i$. Additionally, channels that have a significantly weak signal relative to the channel with the strongest signal are not used for the combined results and assigned a weight factor of zero. Specifically, in multi-channel MRS, regions of interest close to receive coil elements benefit from improved signal-to-noise ratios. Therefore, data received from regions of interest close to receive coil elements are appropriately weighted to take advantage of the improved signal-to-noise ratios. The signal characteristics from each coil depend on a number of factors including the orientation of the coil with respect to the $B_0$ field, the proximity of the coil to the volume generating the signal, coil loading, coil-to-coil coupling effects, and the permeability and permitivity of the medium through which the radio-frequency signal travels prior to being received by the coil elements. Accordingly, the current invention weights data received to take advantage of the improved signal-to-noise ratios. Once weighted, the data is then normalized according to:

$$1.0 = \sum_L w_i; \quad \text{(Eqn. 2)}$$

where L refers to the number of channels used.

Water-suppressed data is also collected from each coil element and the data from each coil element is averaged 112 to obtain an averaged water-suppressed data set, s[n]. A phase correction vector 124, c[n], is then applied 127 to the reference data set, r[n], and the water-suppressed data set, s[n] at 126. The phase correction vector, c[n], may be defined by:

$$c[n] = A_{zp} \cdot g[n] \cdot w[n] \quad \text{(Eqn. 3);}$$

wherein w[n] is a windowing function, $A_{zp}$ is defined by r*[0], and g[n] is defined by:

$$g[n] = e^{-i((\omega m - \omega l p) \, n - \phi_s[n])} \quad \text{(Eqn. 4);}$$

wherein $\omega_m$ is the largest frequency component of the non-water suppressed data set, s[n], $\omega_{lp}$ is the number of phase cycles in the non-water suppressed data set, s[n], and $\phi_s[n]$ is the phase spline smoothing factor from an unwrapped phase of:

$$r[n] e^{-i(w_m + w_{lp})n} \quad \text{(Eqn. 5).}$$

Applying the phase correction vector, c[n], removes residual water signal from the water-suppressed data, s[n], and also removes distortions due to eddy currents. Specifically, the correction vector, c[n], is multiplied by the reference data set, r[n], and the water-suppressed data set, s[n] as:

$$r_{corrected}[n] = c[n] \cdot r[n] \quad \text{(Eqn. 6)}$$

and $$s_{corected}[n] = c[n] \cdot s[n] \quad \text{(Eqn. 7),}$$

respectively. Water subtraction 128, in which a scaled version of the reference data set is subtracted from the water-suppressed data set of each receiver channel, is performed and a Fourier Transform is applied 130 to the phase-corrected, water-suppressed data set, $S_{corrected}[n]$, with residual water removed. Prior to computing a frequency spectrum, $S_{results}[k]$, the data is zero-padded for greater resolution. The results of the Fourier Transform 130, for each receiver coil, where the number of receive coils is L, is combined 132 by summing the computed results from the frequency spectrum $S_{results}[k]$, wherein $$S_{results}(k) = Re\{Fr\{s_{signal}[n]\}\} \quad \text{(Eqn. 8)}$$

and $$s_{signal}[n] = a_{scale} \cdot s_{corrected}[n] - r_{corrected}[n] \quad \text{(Eqn. 9);}$$

where $a_{scale}$ is a constant representing the ratio of largest magnitudes of frequency components from the water suppressed and non-water suppressed data sets:

$$a_{scale} = \frac{\max|F_T\{s_{corrected}[n]\}|}{\max|F_T\{r_{corrected}[n]\}|} \quad \text{(Eqn. 10)}$$

and $F_T$ signifies the Fourier Transform or other similar technique, as will be discussed, for computation of frequency from time domain.

A summation of the independently processed receiver coil data sets is performed to yield a single superset of MRS results that takes into account each coil's respective weight, such that:

$$S_{combined}[k] = \sum_L S_{results}[k] \cdot w_i \qquad \text{(Eqn. 11)}$$

The absorption spectrum 134, $S_{combined}[k]$ is then plotted for the combined real values of the complex Fourier Transform of the phase-corrected, water-suppressed signal with residual water removed. As such, a 1D absorption spectrum is displayed on a monitor or other area interface that is an assimilation of the data sets from each of the multiple receiver coils influenced by each coil's weighting. The absorption spectrum shows the chemical shift of various metabolites in parts per million (ppm) and can be used for the quantification of metabolites in vivo. The resulting 1D spectral plot includes peaks from which a clinical diagnosis may be made without a separate interpretation of the results of each receiver coil.

For 1D plots representing the absorption spectrum, the peak area or the peak height representing a particular frequency component, can be calculated and compared to other peaks. For example, referring to FIG. 3, a 1D plot 140 representing a combined absorption spectrum for multiple receiver channel data having a number of peaks is shown. While such a plot is not in and of itself novel, to produce such a single plot from multiple receive channels as described herein is novel. When reviewing the 1D plot or spectrum 140, a medical professional often uses a creatine peak 142 as a reference for in vivo MRS studies. In some cases, the mere presence of a particular peak may indicate a clinically significant diagnosis. For example, lactate 144 which, in the example, shows up as a doublet, should never occur in a normal human brain. Therefore, the presence of lactate 144 would potentially indicate damage from acute stroke. As a further example, if the NAA peak 146 was lower and the creatine peak 142 and the choline peak 148 were higher, the plot 140 would be indicative of a patient stricken with Alzheimer's disease.

Additionally, beyond the Fourier transform, several other nonparametric techniques can be used for generating results from MRS studies. Two nonparametric techniques that can be used for MRS analysis, which employ adaptive filter bank approaches, are the 1D Capon method and the 1D APES method. The filter bank approach to power spectral estimation employs a band-pass filter with a fixed bandwidth to estimate the power spectral density (PSD) of a given frequency component. The basic periodogram, as described in Eqn. 11, is a filter bank approach based on the standard Fourier transform.

$$\hat{\phi}(\omega) = \frac{1}{N}\left|\sum_{n=0}^{N-1} x[n]e^{-i\omega n}\right|^2 \qquad \text{(Eqn. 12)}$$

Capon and APES are filter bank approaches that improve the estimate of the PSD by creating one data-dependent band-pass filter for each spectral point being estimated. The band-pass filter is created by a least-squares minimization process, which attempts to minimize the total output power of the filter, yet pass the frequency component of interest unaltered. A second least-squares process is then implemented to estimate the amplitude of the filtered signal. Capon and APES provide more accurate spectral estimates with lower sidelobes and narrower spectral peaks than the Fourier Transform based periodogram techniques.

However, 1D Capon and 1D APSES methods fail to take into account, at least in a direct way, the damping associated with each signal component in Eqn. 1. Thus, since the detected amplitude will be altered by the damping, it is difficult to accurately estimate the amplitudes of the various signal components. To alleviate this problem, 2D Capon and 2D APES techniques can be used to obtain a 2D absorption spectrum plot.

One benefit of a high-resolution 2D spectral plot derived by Capon or APES is that peaks that are close in frequency may be separated if the associated damping factors are different from one another. Another benefit of the 2D spectral plots is that the damping information provided by Capon or APES provides an effective means of estimating $T_2^*$, the effective decay rate of transverse magnetization, for several metabolites of interest. Furthermore, unlike 1D methods, the true amplitudes are not masked by damping effects. Empirical results have shown that Capon analysis provides a more accurate estimate of frequency and damping since it provides fine resolution to resolve closely spaced peaks, while APES provides a more accurate estimate of the amplitude for a given frequency and damping factor. As will be shown, 2D absorption plots may also benefit from the current invention through its multiple receiver channel weighting and combination techniques.

For 2D Capon and 2D APES the filter is subject to the constraints of a damped sinusoid of interest, represented by:

$$A e^{j\theta} e^{(-\sigma+j\omega)n} \qquad \text{(Eqn. 13)}$$

This constraint is based upon the extent that the sinusoid of interest passes undistorted through the filter, while the total output energy of the filter is minimized. Two-dimensional Capon and 2D APES provide an estimate of both the amplitude and phase for each frequency and damping factor of an input signal. The 2D Capon and 2D APES methods provide high-resolution 2D MRS results showing both frequency, $\omega$, and damping, $\sigma$. In the case of a 2D proton spectroscopy, the 2D Capon method and the 2D APES method, each improves upon the results of 1D proton spectroscopy. The results have more defined peaks and more precise amplitude. Additionally, a damping factor representing the exponential decay of the associated metabolite is also provided and is useful for clinical diagnosis.

The 2D Capon and APES methods may be summarized as follows. Given a complex signal, $x[n]$, $n=0,1,\ldots N+M-2$, defined:

$$\bar{x}[n]=[x[n]\ x[n+1]\ \ldots\ x[n+M-1]]^T \qquad \text{(Eqn. 14),}$$

which has a covariance matrix:

$$R_0 = \sum_{n=0}^{N-1} \bar{x}[n]\bar{x}^H[n], \qquad \text{(Eqn. 15)}$$

where $(\cdot)^H$ denotes a Hermitian (complex conjugate) transpose. The signal $x[n]$ is filtered to produce $x_{\sigma,\omega}[n]$ at each $\sigma$ and $\omega$ of interest. The filtered signal $x_{\sigma,\omega}[n]$ is given by:

$$x_{\sigma,\omega}[n]=\bar{h}^H(\sigma,\omega)\bar{x}[n],\ n=0,1\ldots N-1 \qquad \text{(Eqn. 16),}$$

where $\bar{h}(\sigma,\omega)$ is an M-vector of FIR filter coefficients. The 2D Capon and 2D APES filters are specified, respectively, by:

$$\bar{h}_{Capon}(\sigma, \omega) = \frac{R_0^{-1}\bar{s}(\sigma, \omega)}{\bar{s}^H(\sigma, \omega)R_0^{-1}\bar{s}(\sigma, \omega)} \quad \text{and} \qquad \text{(Eqn. 17)}$$

$$\bar{h}_{APES}(\sigma, \omega) = \frac{Q_0^{-1}(\sigma, \omega)\bar{s}(\sigma, \omega)}{\bar{s}^H(\sigma, \omega)Q_0^{-1}(\sigma, \omega)\bar{s}(\sigma, \omega)}, \qquad \text{(Eqn. 18)}$$

where:

$$\bar{s}(\sigma,\omega)=[1\ e^{(-\sigma+1\omega)}\ldots e^{(-\sigma+j\omega)(M-1)}]^T \qquad \text{(Eqn. 19)}$$

and $$Q_0(\sigma, \omega) = R_0 - \frac{1}{L_N(\sigma)}\bar{X}_N(\sigma, \omega)\bar{X}_N^H(\sigma, \omega), \qquad \text{(Eqn. 20)}$$

where:

$$\bar{X}_N(\sigma, \omega) = \sum_{n=0}^{N-1} \bar{x}[n]e^{-\sigma n}e^{-j\omega n} \quad \text{and} \qquad \text{(Eqn. 21)}$$

$$L_N(\sigma) = \frac{1-e^{-2\sigma N}}{1-e^{-2\sigma}}. \qquad \text{(Eqn. 22)}$$

The least-squares estimate of the spectrum $S(\sigma,\omega)$ is then determined at each $\sigma$ and $\omega$ of interest from the filtered signal $x_{\sigma,\omega}[n]$ by the formula $$S(\sigma, \omega) = \frac{1}{L_N(\sigma)}\sum_{n=0}^{N-1} x_{\sigma,\omega}[n]e^{-\sigma n}e^{-j\omega n} \quad \text{or} \qquad \text{(Eqn. 23)}$$

$$S(\sigma, \omega) = \frac{1}{L_N(\sigma)}\bar{h}^H(\sigma, \omega)\bar{X}_N(\sigma, \omega); \qquad \text{(Eqn. 24)}$$

where the choice of $\bar{h}(\sigma,\omega)$ determines the method used.

Referring again to FIG. 2, MRS data is again acquired 110 from multiple receive channels of an MR system simultaneously. After data acquisition, the raw data is pre-processed. That is, once MRS data is acquired 110, non-water suppressed reference data is collected, and averaging 114 is used to yield an averaged set of reference data, r[n], for each receiver coil, where n represents normalized time.

The reference data, r[n], is subjected to the DC mixing 116, zero phasing 118, linear phase correction 120, and phase spline smoothing 122 to compute 124 a phase correction vector, c[n]. Additionally, the reference data sets, r[n], are used to determine whether data from a particular coil should be used 125 to generate combined results. If it is determined that data from a particular coil should be used, the reference data set, r[n], is also used to assign weights 125 to each receiver coil.

The weightings 125 are used to increase the influence of particular data sets on a combined superset of data. Specifically, those channels with greater signal-to-noise ratios are more heavily weighted. Therefore, data received from regions of interest close to receive coil elements are appropriately weighted to take advantage of the improved signal-to-noise ratios. The signal characteristics from each coil depend on a number of factors including the orientation of the coil with respect to the $B_0$ field, the proximity of the coil to the volume generating the signal, coil loading, coil-to-coil coupling effects, and the permeability and permitivity of the medium through which the radio-frequency signal travels prior to being received by the coil elements.

A weighted least-squares estimator for 2D Capon or 2D APES may also be implemented. Specifically, an exponential time-weighting factor to adjust the least-squares error minimization criterion for both 2D Capon and 2D APES is incorporated in such a way that data samples are weighted differently based on how early or late they occur in the time sequence. Thus, signal elements are preferentially weighted in time sequentially to take advantage of improved signal-to-noise characteristics earlier in the signal. The exponential time weighting factor used to adjust the least-squares error minimization criterion in 2D Capon and 2D APES is a novel technique used for processing MRS data and is thus part of the invention.

As previously described, water-suppressed data sets are also collected 110 from each coil element and the data from each coil element is averaged to obtain a number of averaged, water-suppressed data sets, s[n] 112. Data acquired during the reference acquisition is used to compute a phase correction vector 124 that is applied to the water-suppressed data 126. The reference data is also used to remove residual water. The phase correction vector, c[n] 128, is applied to the reference data, r[n] 127, and the water-suppressed data, s[n] 126. Applying c[n] removes residual water signal from the water-suppressed data sets, r[n]. Water subtraction 128, in which a scaled version of the reference data sets is subtracted from the water-suppressed data sets, is performed and a nonparametric technique, implementing an adaptive filter bank, is used to generate the results from the phase-corrected, water-suppressed data sets with residual water effects removed. Specifically, either a 2D Capon or 2D APES technique is employed. The current invention performs pre-processing of raw data prior to 2D Capon or 2D APES by applying the previously described method of MRS data pre-processing involving phase correction and residual water removal.

In implementing 2D Capon, a frequency spectrum a) versus damping a, $C_{results}[\sigma,\omega]$, is calculated 150 from the time domain data representing the corrected and enhanced MRS signal, $S_{signal}[n]$, using the non-parametric filter banks according to the Capon technique describe above. On the other hand, if 2D APES is implemented, a frequency spectrum ω versus damping σ, $A_{results}[\sigma,\omega]$, is calculated 152 from the time domain data representing the corrected and enhanced MRS signal, $S_{signal}[n]$, using the non-parametric filter banks according to the APES technique described above.

The frequency spectrum ω versus damping σ results for each receiver coil, including each receive coil's respective weighting, as previously described, are then combined 132. If a 2D Capon technique is employed the combination results in a supserset of data 154, $C_{combined}[\sigma,\omega]$, defined by:

$$C_{combined}[\sigma, \omega] = \sum_L C_{results}[\sigma, \omega] \cdot w_i. \qquad \text{(Eqn. 25)}$$

However, if a 2D APES technique is employed, the combination results in a superset of data 156, $A_{combined}[\sigma,\omega]$, defined by:

$$A_{combined}[\sigma, \omega] = \sum_L A_{results}[\sigma, \omega] \cdot w_i. \qquad \text{(Eqn. 26)}$$

From the 2D Capon method and 2D APES method, 2D absorption spectrums, $C_{combined}[\sigma,\omega]$, and $A_{combined}[\sigma,\omega]$ 140, are displayed, respectively, for data acquired over multiple receiver channels. These absorption spectra allow a reviewing medical professional to interpret the data received by each receiver coil simultaneously thereby increasing diagnosing time and accuracy.

Figure 3:
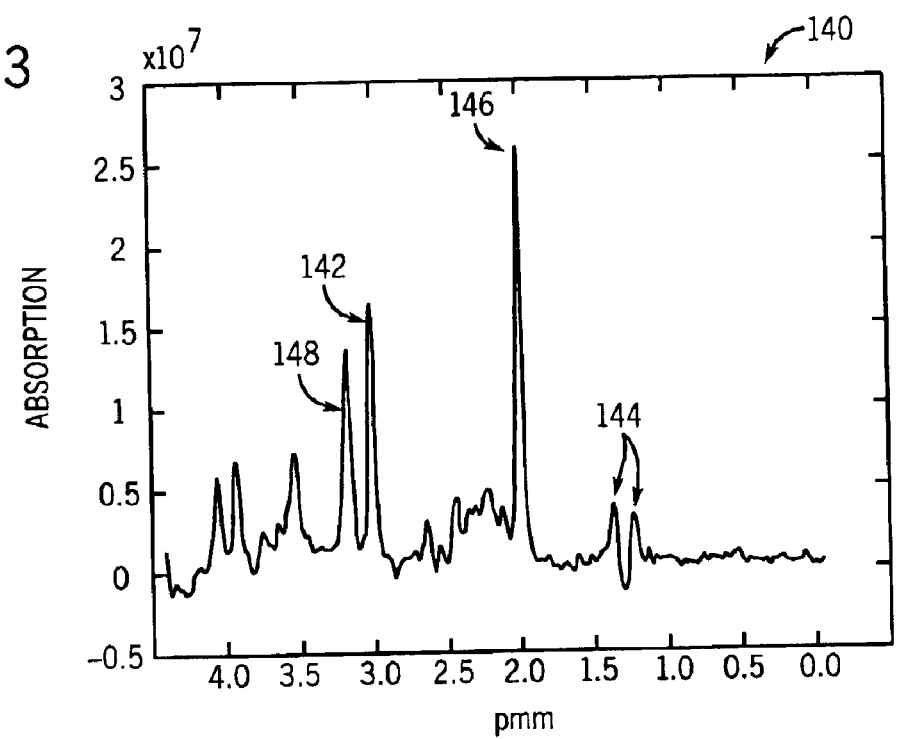
FIG. 3 is an example of a single 1D absorption spectrum compiled from a multiple receiver MR proton spectroscopy scan in accordance with one embodiment of the present invention.
Figure 4:
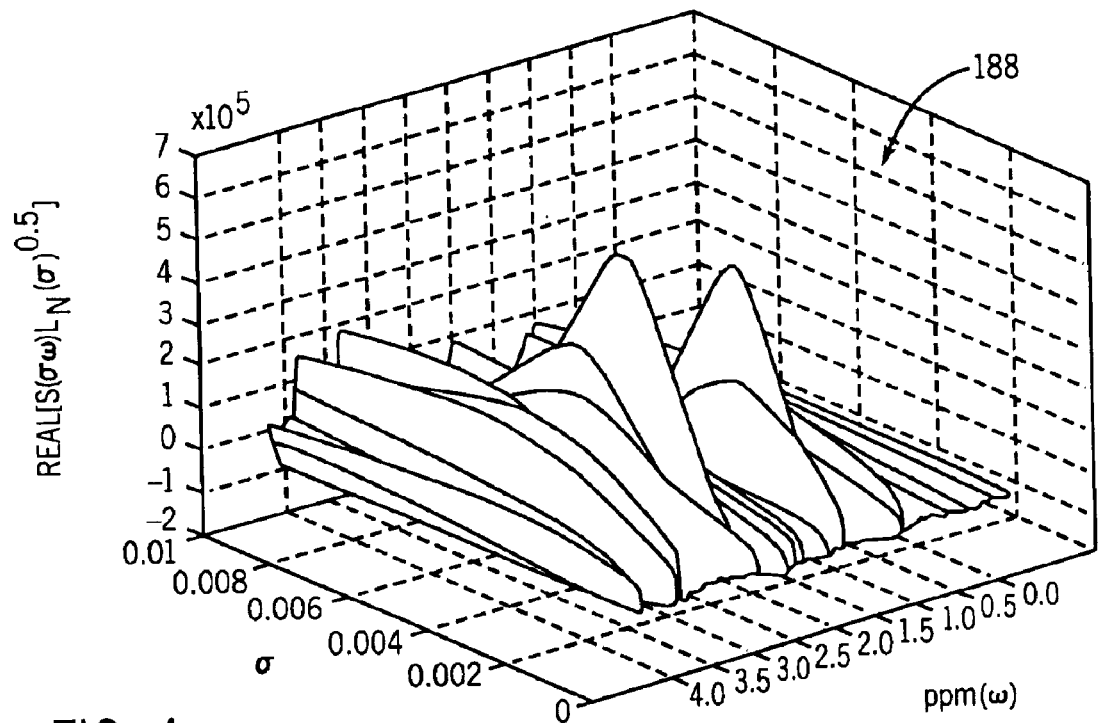
FIG. 4 is an example of a single 2D absorption spectrum compiled from a multiple receiver MR proton spectroscopy scan in accordance with one embodiment of the present invention.

Referring now to FIG. 4, a combined 2D absorption spectrum 158 is shown. When compared with the 1D absorption spectrum of FIG. 3, FIG. 4 shows improved peak-to-noise ratios vs. the MRS results from FIG. 3. The ratios of peak heights vs. the standard deviation of a noise region (near 0.0 ppm) are provided for several peaks of interest. This distinction becomes more evident when comparing peak-to-noise ratios for 2D Capon or 2D APES with each peak of a corresponding noise region with the same value of damping, σ. Again, by compiling a single absorption spectrum, rather than requiring a medical professional to review an absorption spectrum from each receiver coil independently and individually, the burden on the reviewing medical professional is lowered and typically makes the review process considerably more efficient. The combined 2D absorption spectrum 158 allows a reviewing medical professional to interpret the data received by each receive coil simultaneously.

The invention described above is a technique for multi-channel MRS whereby MR signals are simultaneously acquired from multiple coils and individually processed to generate multiple sets of MRS results. Furthermore, the multiple sets of MRS results are combined to form a single superset of MRS results, such that the MRS results are displayed as a proton MRS absorption spectrum from the single superset of MRS results. It is contemplated that the above architecture and technique can be embodied in any modality of a medical imaging scanner capable of providing data required for MRS.

It is further contemplated that the above technique be embodied in a MRI system having a plurality of gradient coils positioned about a bore of a magnet to impress a polarizing magnetic field and an RF transceiver system and an RF switch controlled by a pulse module to transmit RF signals to an RF coil assembly to acquire MR images. The MRI system also includes a computer programmed to acquire MR signals from multiple receiver channels and process the MR signals from each channel independently. The computer then combines the processed MR signals from each coil into a single set of MRS results and displays a proton MRS absorption spectrum from the single composite set of MRS results.

It is additionally contemplated that the above technique be embodied in a computer program including instructions which when executed by a computer cause the computer to process MR data from the multiple coils independently. The computer is also caused to combine the processed MR data into a single composite set of MRS results and display the set as a single MRS absorption spectrum.

The present invention has been described in terms of the preferred embodiment, and it is recognized that equivalents, alternatives, and modifications, aside from those expressly stated, are possible and within the scope of the appending claims.

What is claimed is:

1. A method of multi-channel MR spectroscopy (MRS) comprising the steps of:
   simultaneously acquiring MR signals from multiple coils;
   processing the MR signals individually to generate multiple sets of MRS results;
   combining the multiple sets of MRS results to form a single superset of MRS results; and
   generating and displaying a proton MRS absorption spectrum from the single superset of MRS results for clinical inspection.

2. The method of claim 1 wherein the proton MRS absorption spectrum includes a single 2D proton MRS absorption spectrum.

3. The method of claim 1 wherein the step of processing includes steps of:
   averaging individual frames of non-water suppressed reference data to obtain a non-water suppressed reference data set, r, for data from each coil;
   averaging individual frames of water suppressed data to obtain a water suppressed data set, s[n], for data from each coil;
   applying a phase correction vector to each data set r[n] and s[n]; and
   removing residual water signal from the water suppressed data set to generate a corrected MRS signal.

4. The method of claim 3 wherein the steps of combining includes the steps of:
   determining a maximum magnitude of the non-water suppressed data set for data from each coil;
   from the maximum magnitude for data from each coil determining a weighting factor for data from each coil;
   applying a respective weighting factor to each set of MRS results based on the coil used to acquire the MR signals for the respective set of MRS results as weighted sets of MRS results; and
   summing the weighted sets of MRS results to form the single superset of MRS results.

5. The method of claim 4 further comprising the step of normalizing the weighting factors.

6. The method of claim 3 further comprising the step of zero-padding time domain data of the corrected MRS signal and wherein the steps of generating and displaying a proton MRS absorption spectrum includes the step of generating a frequency spectrum from the zero-padded time domain data.

7. The method of claim 6 further comprising the step of displaying real portions of a complex result of the frequency spectrum representing the absorption spectrum for clinical inspection.

8. The method of claim 3 wherein the step of generating and displaying a single portion MRS absorption signal includes the step of applying a nonparametric filter bank technique to time domain data representing the corrected MRS signal to generate a 2D frequency spectrum versus damping.

9. The method of claim 8 wherein the nonparametric filter bank technique includes one of a Capon analysis and an APES analysis.

10. The method of claim 3 further compromising the step of determining the phase vector c[n] by:
    multiplying the non-water suppressed data set, r[n], by a scalar, $A_{zp}=r^*[0]$;
    determining a largest frequency component $\omega_m$, of the non-water suppressed data set, s[n]; determining a number of phase cycles, $w_{lp}$, in the non-water suppressed data set, s[n];
    determining a phase spline smoothing factor $\phi_s[n]$, from an unwrapped phase of $$r[n]e^{-i(w_m+w_{lp})n}$$

generating a data windowing function ω[n]; and
    multiplying $A_{zp} \cdot e^{-i(w_m+w_{lp})n+\phi_s^{(n)}}$ and ω[n].

11. The method of claim 10 further comprising the step of determining a corrected non-water suppressed signal, $r[n]_{corrected}=c[n]\cdot r[n]$, and determining a corrected water suppressed signal, $s[n]_{corrected}=s[n]\cdot r[n]$.

12. The method of claim 11 wherein the step of generating and displaying a single proton MRS absorption spectrum includes the steps multiplying $s_{corrected}[n]$ by a scalar, $a_{scale}$, and subtracting r[n] from the product wherein $a_{scale}$ includes a constant representing a ratio of largest magnitude of frequency components of the water suppressed and non-water suppressed data sets, sand r[n], respectively.

13. A magnetic resonance imaging (MRI) system having a plurality of gradient coils positioned about a bore of a magnet to impress a polarizing magnetic field and an RF transceiver system and an RF switch controlled by a pulse module to transmit RF signals to a multi-receiver channel RF coil assembly to acquire MR images; and a computer programmed to:

acquire MR signals from multiple receiver channels;

process the MR signals from each receiver channel independently;

combine the processed MR signals from each receiver channel into a single composite set of MRS results; and display a proton MRS absorption spectrum from the single composite set of MRS results.

14. The MRI system of claim 13 wherein the proton MRS absorption spectrum includes a single composite 2D proton MRS absorption spectrum.

15. The MRI system of claim 13 wherein the computer is further programmed to assign weight factors to the MR results from each coil before the MR results are combined.

16. The MRI system of claim 15 wherein a set of MRS results is assigned a weight factor of zero if the acquired MR signal is determined to be weak as compared to other MR signals acquired.

17. The MRI system of claim 15 wherein the computer is further programmed to normalize the weight factors.

18. The MRI system of claim 13 wherein the computer is further programmed to apply a nonparametric filter bank technique to time domain data representing the corrected MRS signal to generate a frequency spectrum versus damping.

19. The MRI system of claim 13 wherein the computer is further programmed to:

average individual frames of non-water suppressed reference data to obtain a non-water suppressed reference data set, r, for data from each coil;

average individual frames of water suppressed data to obtain a water suppressed data set, s, for data from each coil; and apply a phase correction vector to each data set r[n] and s[n] to remove residual water signal from the water suppressed data set to generate a corrected MRS data set for data from each coil.

20. The MRI system of claim 13 wherein the computer is further programmed to:

determine a maximum magnitude of the non-water suppressed data set for data from each coil;

determine a weighting factor for each coil from the maximum magnitude for data from each coil;

apply the weighting factor to each set of MRS results based on the coil used to acquire the respective set of MRS results as weighted sets of MRS results; and combine the weighted sets of MRS results to form the single superset of MRS results.

21. A computer readable storage medium having stored thereon a computer program to generate a single composite MRS spectrum from MR data acquired from multiple coil elements that comprises a set of instructions, which when executed by a computer, causes the computer to:

acquire MR data from multiple coil elements independently;

combine the processed MR data into a single composite set of MRS results; and display a single MRS absorption spectrum as a function of the combined set of MRS results acquired from the multiple coil elements.

22. The computer program of claim 21 further comprising instructions to process the MR data from multiple coil clients independently.

23. The computer program of claim 22 further comprising instructions to assign weight factors to the MRS results from each coil before the processed MRS results are combined.

24. The computer program of claim 23 having further instructions to assign a weight factor of zero if an acquired MR signal is determined to be weak when compared to other acquired MR signals.

25. The computer program of claim 23 having further instructions to preferentially weight each data set based on data acquisition time.

26. The computer program of claim 21 wherein the proton MRS absorption spectrum includes a single 2D proton MRS absorption spectrum with both frequency and damping factors represented.

27. The computer program of claim 21 having further instructions to apply a non-parametric filter bank technique to time domain data representing the corrected MRS signal to generate a frequency spectrum versus damping.

* * * * *

UNITED STATES PATENT AND TRADEMARK OFFICE
CERTIFICATE OF CORRECTION

PATENT NO. : 6,891,371 B1
DATED : May 10, 2005
INVENTOR(S) : Frigo et al.

It is certified that error appears in the above-identified patent and that said Letters Patent is hereby corrected as shown below:

Column 12,
Line 5, delete "r" and substitute therefore -- r[n] --;
Line 52, delete "$W_{lp}$" and insert therefore -- $\omega_{1p}$ --;
Line 59, delete " $r[n]e^{-j(w_m+W_{lp})n}$ " and insert therefor -- $r[n]e^{-j(\omega_m+\omega_{lp})n}$ --;
Line 61, delete " $A_{zp} \cdot e^{-j(w_m+w_{lp})n+\phi_s(n)}$ " and insert therefor -- $A_{zp} \cdot e^{-j(\omega_m+\omega_{lp})n+\phi_s(n)}$ --;

Column 13,
Line 43, delete "r" and substitute therefore -- r[n] --;
Line 45, delete "s" and substitute therefore -- s[n] --.

Signed and Sealed this

Thirtieth Day of August, 2005

JON W. DUDAS
*Director of the United States Patent and Trademark Office*